United States Patent [19]

Smith et al.

[11] 4,442,412
[45] Apr. 10, 1984

[54] PHASE LOCKED-LOOP GENERATOR WITH CLOSED-LOOP FORCING FUNCTION SHAPER

[75] Inventors: Edwin B. Smith, Medford Lakes; Richard A. Craft, Cinnaminson, both of N.J.

[73] Assignee: RCA Corporation, New York, N.Y.

[21] Appl. No.: 320,433

[22] Filed: Nov. 12, 1981

[51] Int. Cl.³ .............................................. H03B 3/08
[52] U.S. Cl. ......................................... 331/1; 331/17; 331/25
[58] Field of Search ...................... 331/1 A, 17, 25, 16, 331/18; 328/155; 307/271

[56] References Cited
U.S. PATENT DOCUMENTS 4,103,250  7/1978  Jackson ............................ 331/1 A
4,190,807  2/1980  Weber ............................... 331/1 A
4,380,742  4/1983  Hart .................................. 331/17
4,382,234  5/1983  Olbrechls ........................... 331/17

Primary Examiner—Stanley D. Miller
Assistant Examiner—B. P. Davis
Attorney, Agent, or Firm—J. S. Tripoli; R. L. Troike; R. E. Smiley

[57] ABSTRACT

A phase locked-loop circuit includes a non-linear voltage controlled oscillator ideally producing a desired output frequency as a function of time and a memory producing signals which add to the phase locked-loop phase error feedback signal to correct for the VCO non-linearities. A calibration circuit upon activation is responsive to the phase error feedback signal for altering the contents of the memory such as to reduce or eliminate the phase error.

8 Claims, 5 Drawing Figures

PHASE LOCKED-LOOP GENERATOR WITH CLOSED-LOOP FORCING FUNCTION SHAPER

The Government has rights in this invention pursuant to Subcontract No. MIT/LL PO#BX-435 under Contract No. F19628-80-C-0002 awarded by the Dept. of the Air Force.

This invention relates to phase locked-loop generators and more particularly to such generators which include a memory providing signals which aid in reducing phase errors in the output signal.

Phase locked-loop (PLL) systems typically include a voltage controlled oscillator (VCO) to produce the output signal. VCO's are typically non-linear in that $f \neq KV$ where f is the output frequency, K is a constant and V is the input voltage. Where the desired output frequency changes as a function of time in some predetermined manner it is known to incorporate a memory which stores voltage signals. The stored signals provide the appropriate voltage input to the VCO as a function of time and include the correcting voltages to compensate for the VCO non-linearities.

The memory, which is usually a digital memory, is combined with a digital-to-analog (D/A) converter to produce voltage signals as a function of time to be added to the conventional phase error signal. The resulting composite signal, when applied to the VCO input, is desired to be of correct shape (vs. time) as to yield minimum phase error in the VCO output. Such a modified system in the present art may fail to reduce the errors to the minimum since linearity errors in the VCO change with temperature, long-range time and with changer of PLL components.

In accordance with a preferred embodiment of the present invention, the error signals generated by the PLL as it is producing its output frequency pattern are algebraically added to the signals in the aforementioned memory to substantially reduce the non-linearity error in the PLL system.

Figure 1:
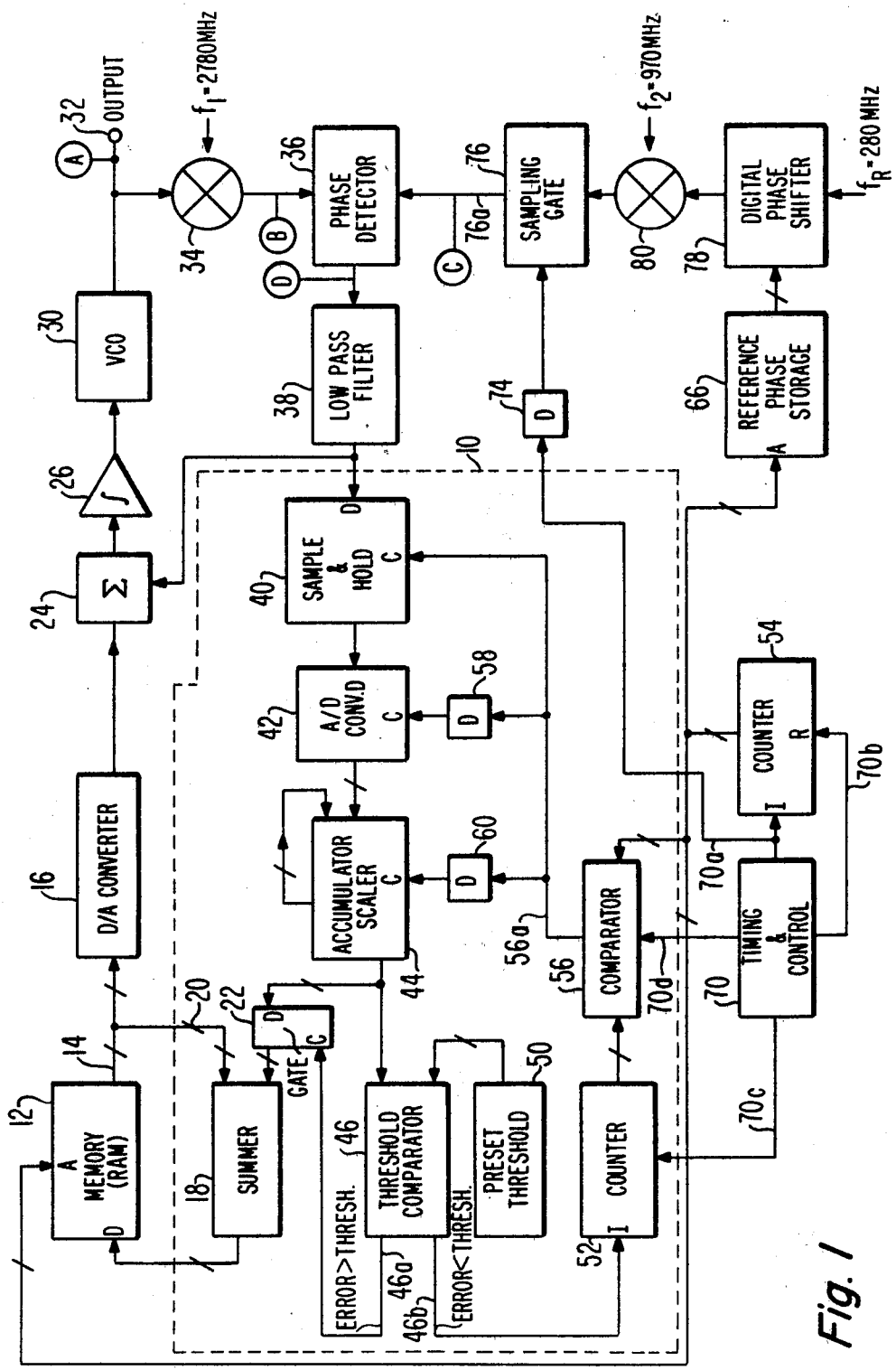
FIG. 1 is a PLL system in electrical block schematic form in accordance with a preferred embodiment of the invention.

With reference to FIG. 1 all elements outside dashed box 10 are part of a conventional PLL circuit for producing a ramp output signal as illustrated in FIG. 2A. The times and frequencies illustrated in FIG. 2A and described hereinafter in the specification are illustrative only and not intended to limit the scope of the invention. Elements within dashed box 10 are part of a calibration system which is either manually or automatically triggered to calibrate the system of FIG. 1.

Random access memory (RAM) 12 is of the type capable of being written into and being read from and for the exemplary system may store 1,000 8-bit words. RAM 12 is coupled by a multiconductor cable 14 to a digital-to-analog converter (D/A) 16 and to one input of a digital algebraic summation circuit 18. Multiconductor cables are indicated as such with a slash (/) symbol such as 20 and have wires at least equal in number to the number of bits transmitted in parallel thereover.

The output of summer 18 is connected to the data (D) input of memory 12. The output of a gate 22 is connected to the second input of summation circuit 18.

D/A 16 is coupled to one input of a summation circuit 24 which may simply comprise two resistors (not shown) each coupled to receive an input signal and coupled together at their distal ends to an integrator 26. Integrator 26 may comprise an operational amplifier with capacitive feedback to the inverting terminal thereof as known to those skilled in the art. The output of integrator 26 is coupled to the input of a voltage controlled oscillator (VCO) 30. As mentioned previously, VCO 30 although ideally linear in reality is typically non-linear necessitating the use of memory 12 in a manner to be hereinafter described. The output of VCO 30 is coupled to the system output terminal 32 and to one input of a lower sideband mixer 34.

Figure 2:
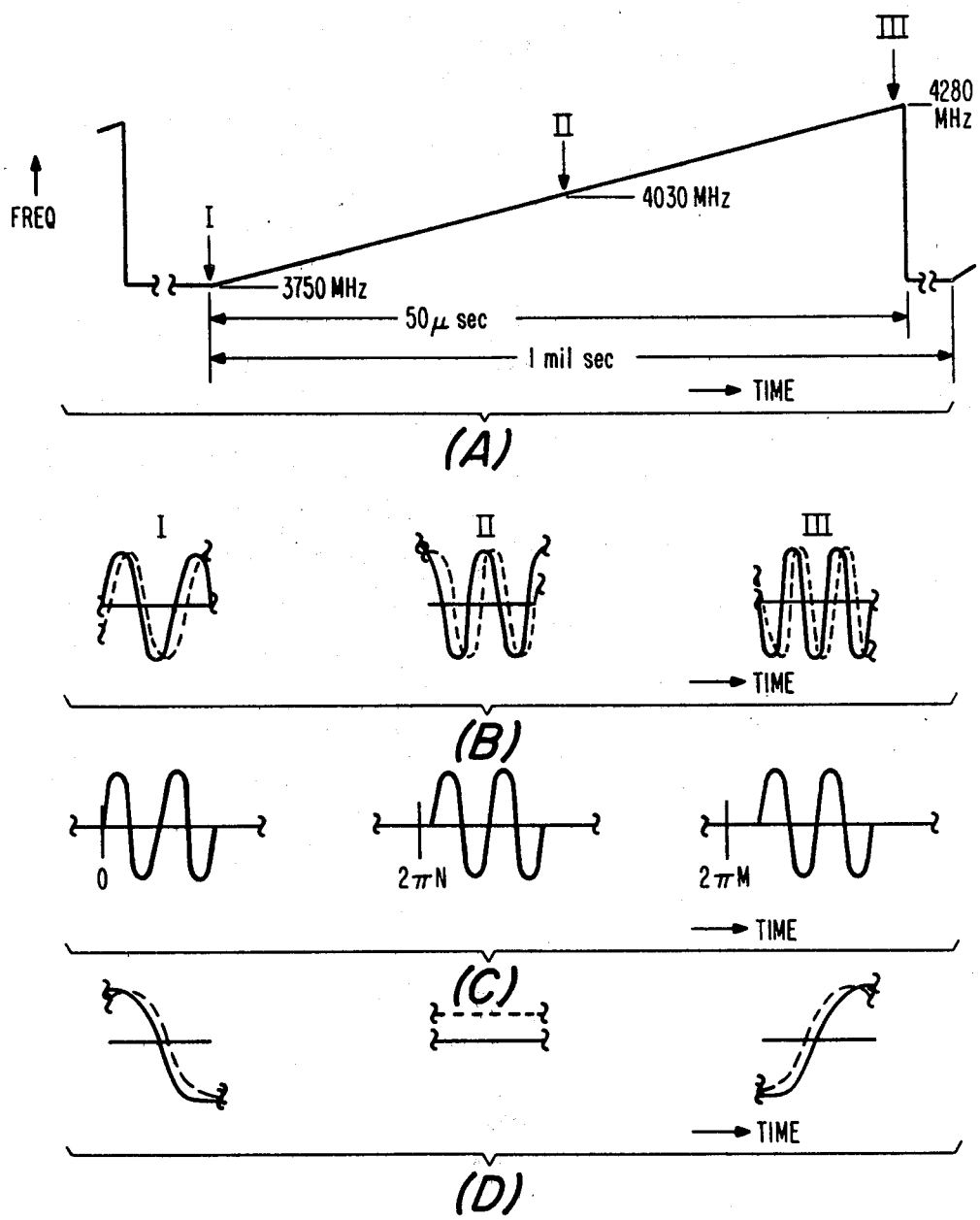
FIGS. 2A-2D are a set of waveforms useful in understanding the operation of the PLL of FIG. 1.

In the exemplary embodiment of the invention VCO 30 is driven in a manner to be described to produce, at output terminal 32 as a function of time, the signal illustrated in FIG. 2A. The exemplary waveform, as illustrated in FIG. 2A, is a recurring ramp of 50 microseconds ($\mu s$) duration with a repetition rate of 1 millisecond. The ramp ranges from an idle frequency of 3750 MHz to 4280 MHz. The encircled letter A, near terminal 32, in FIG. 1, and other encircled letters throughout FIG. 1 refer to similarly lettered waveforms of FIG. 2.

Mixer 34 is receptive of a fixed frequency $f_1$ which in the exemplary embodiment is 2780 MHz and is coupled at its output to a phase detector 36 to provide a suitable intermediate frequency (IF) thereto. In the exemplary embodiment the frequency passed to phase detector 36 ranges between 970 MHz (3750-2780) and 1500 MHz (4280-2780). The output of phase detector 36 is coupled to a low-pass filter 38 which, in effect, averages the signal applied thereto from the phase detector. The output of low-pass filter 38 is coupled to the second input of summing circuit 24 and to the data (D) input of a sample-and-hold circuit (S/H) 40. The output of S/H 40 is coupled to the data (D) input of an analog-to-digital converter (A/D) 42. A/D 42 is coupled to one input of an accumulator-scaler circuit (A/S) 44. One output of A/S 44 is coupled back to a second input of itself.

In the preferred embodiment the accumulator accumulates eight successive digital values produced by A/D 42, then produces the average of (scales) the eight values which is transmitted to one input of a threshold comparator circuit 46 and to the data (D) terminal of gate 22 at which time A/S 44 is reset to accumulate another eight values as will be described more fully hereinafter. The purpose of A/S 44 is to average out or substantially reduce any noise errors present in the signals produced by elements 30, 34, 36, 38, 40 and 42.

A preset threshold value from a source 50 is coupled to the second input of threshold comparator (TC) 46. In a working embodiment preset threshold 50 may simply be a "hard" wired value within TC 46. In response to the receipt of a digital value from A/S 44, which is connected to a second input of threshold comparator 46, the comparator produces an output pulse on one of its two output lines 46a and 46b. Line 46a is connected to the control (C) input of gate 22. Line 46b is connected to the count input (I) of counter 52. If the error signal from A/S 44 is greater than the preset value, line 46a is active and gate 22 in enabled. If the error signal from A/S 44 is less than the preset threshold value, line 46b is active and the pulse thereon increments counter 52.

The output of counter 52 and of a second counter 54 are coupled to respective inputs of a comparator 56. Counter 54 is also coupled to the address (A) input of memory 12 and the address input of a reference phase storage 66. The output of comparator 56, on line 56a, is coupled to the control (C) input of S/H 40, via a short delay 58 to the C input of A/D 42 and via s slightly longer but still short delay 60 to the C input of A/S 44. The delays 58 and 60 are provided to ensure that the signal generated in the circuit preceeding that which contains the delay has stabilized before being clocked into the delay associated circuit.

A timing and control circuit (T/C) 70 is coupled via line 70a to the increment (I) input of counter 54 and via a short delay 74 to a sampling gate circuit 76. T/C 70 is coupled via line 70b to the reset (R) input of input counter 54 and is connected on line 70c to the reset (R) input of counter 52. A line 70d from T/C 70 is connected to comparator 56.

Reference phase storage circuit 66 may comprise an addressable memory addressed by counter 54 which produces a succession of digital words from addresses determined by the count in the counter. Reference phase storage circuit 66 is coupled to a digital phase shifter circuit 78 which also receives a fixed input frequency $f_r$ which may be in the exemplary embodiment 280 MHz. Digital phase shifter circuit 78, in response to signals received from reference phase storage circuit 66 shifts the phase of frequency $f_r$. The output of digital phase shifter 78 is coupled to one input of an additive mixer 80 which also receives a frequency signal $f_2 = 970$ MHz in the exemplary embodiment. The output of sampling gate 76 is coupled to the second input of phase detector 36.

Operation of the circuit of FIG. 1 will be best understood by first describing the operation assuming only those components outside of dashed line 10 are present. It would be desirable to have a signal appearing on line 76a which is precisely and continuously identical in phase and frequency to the signal of FIG. 2A but reduced by 2780 MHz to compensate for the offset frequency provided by $f_1$. Of course, if such a perfect signal were present, there would be no need for the instant invention. Such a signal, though not available, can be piecewise simulated by components 66, 74, 76, 78 and 80. These components provide on line 76a a signal which, at selected instants of time, has the precise phase of the desired signal at terminal 32, though, of a constant frequency of $f_2 + f_r = 1250$ MHz. The frequency 1250 MHz is chosen to be nearly equal to the center frequency of the FIG. 2A waveform less frequency $f_1 = 2780$ MHz.

Reference phase storage 66 has stored, in its random access memory, in successively addressed locations, a succession of values which cause digital phase shifter 78 to shift the phase of frequency $f_r$ as a function of time.

Operation of components 66, 70, 74, 76 and 78 is as follows. T/C 70 produces, on line 70a, a succession of equally spaced pulses having, for example, a period of 50 nanoseconds such that, for example, 1000 pulses are produced during the time that the ramp in FIG. 2A is being produced at terminal 32. These pulses cause phase storage circuit 66 to produce a succession of 1000 values which cause digital phase shifter 78 to shift frequency $f_r$ by 1000 different phases. Phases of frequency $f_r$ are mixed in upper sideband mixer 80 with frequency $f_2$ to produce 1000 different phases of frequency $f_r + f_2$ at the input to sampling gate 76. Upon a transition from one phase to another, the signal at the input to sampling gate 76 is distorted for a short interval of time. Thus, a short delay D from delay 74 after a new phase is selected, sampling gate 76 is opened to pass a small duration portion (about 2 cycles) thereof to phase detector 36.

With momentary reference to FIG. 2A, three arbitrary times during the production of the ramp shown therein are legended I, II and III. FIG. 2C, expanded greatly in time scale from FIG. 2A, illustrates the signals produced on line 76a at those three times. The zero time shown in FIG. 2C at time I is an arbitrarily chosen reference mark. If there were no phase delay, an associated zero crossing at time II would occur at time $2\pi N$ following time zero, where N is an integer. In point of fact a delay is shown in the FIG. 2C, time II caused by the phase shift at that time due to digital phase shifter 78. Likewise, as illustrated in FIG. 2C at time III, if there were no shift in phase of the signal through the phase shifter 78, a zero crossing would occur at time $2\pi M$, where M is an integer greater than N, but again because of a phase shift in phase shifter 78 the actual signal is shifted as illustrated.

Phase detector 36 mixes signals from sampling gate 76 with signals from VCO 30 adjusted in frequency by mixer 34. In the ideal situation the output signal from phase detector 36 has an average value of 0, as illustrated by the three solid-line time-spaced waveforms of FIG. 2D. (Waveforms 2D at times I and II have as much "solid-line" signal above the horizontal reference line as below.) Low pass filter 38, to which signals from phase detector 36 are passed, performs an averaging function and therefore, in the ideal situation, produces at its output essentially a zero signal which is coupled to summer 24. The magnitude of this signal is representative of the phase error between the generated signal and the phase reference signal.

Simultaneous with the generation of phase reference signals on line 76a, the successive counts in counter 54 address successive locations in memory 12. In the prior art, memory 12 is preloaded with digital values and is addressed by counter 54 as storage 66 is addressed. The digital values read from memory 12 are converted to analog signals in D/A 16 and applied to summer 24 with the ideally zero voltage error signal from low pass filter 38. The signals in memory 12 are intended to compensate, as a function of voltage and time, signals produced by VCO 30 during the generation of the desired output signal such as the ramp of FIG. 2A. In point of fact, however, as mentioned previously, the nonlinearities of VCO 30 do vary with temperature and with long range time.

Thus, in accordance with the invention, memory 12 is, upon command, updated to contain signals which just compensate for non-linearities in VCO 30 such that the signal from low pass filter 38 to summer 24 is at or near zero at all times during the generation of the desired output signal from VCO 30. In the case of the ramp signal, FIG. 2A, at the termination of the ramp, that is, just beyond point III, T/C 70 issues a reset pulse on line 70b which resets counter 54 and causes the counter to remain reset until the start of a subsequent ramp signal.

Operation of the calibration components within dashed box 10 in conjunction with those outside box 10 is typically initiated manually by a structure (not shown) within T/C 70 and is as follows. Initially it will be assumed that the count in counter 52 will correspond to the count in counter 54 since both counters are initially assumed to be reset by T/C 70 on lines 70c and 70b, respectively. Therefore, at the start of the calibration cycle, when a momentary pulse appears on line 70d, a momentary pulse is produced by a comparator 56 on line 56a which causes S/H 40 to hold the error signal, if any, produced by low pass filter 38. The error signal results from the difference in phases of the two signals applied to phase detector 36. Dashed lines in FIG. 2B represent signals which are out of phase with the idealized signals of FIG. 2C. The resulting error signals are illustrated in the dashed lines of FIG. 2D.

After the error sample is held, it is converted to a digital signal by A/D converter 42 and added to the contents of A/S 44 which is initially assumed to be set to zero by internal structure. The digital error signal is temporarily stored within A/S 44 while counter 54 is quickly advanced by pulses from T/C 70 to thus cause production of the ramp signal, FIG. 2a. Once counter 54 is advanced by a single count, it no longer contains the same count as that in counter 52. Therefore no pulses are produced on line 56a while the ramp of FIG. 2a is being generated.

At the start of the next subsequent ramp, the counts in counters 52 and 54 will again momentarily agree and the second error signal from low pass filter 38 (if any) is held by S/H 40, digitized by A/D 42 and accumulated with the previous signal in A/S 44. This process repeats six more times at the start of six subsequent ramp signals.

At the end of eight such ramp cycles (the number eight is arbitrary and it is chosen as previously mentioned to nullify the effects of any noise which may be present at the output of low pass filter 38), the resultant digital signal in A/S 44 having been divided by 8 (scaled) is fed to threshold comparator 46. If the error signal fed to the comparator is greater than the very small allowable error signal, as predetermined by preset threshold 50, a pulse appears on line 46a which primes gate 22 to pass the digitized error signal to summer 18 wherein it is added algebraically with the signal from the associated memory location in memory 12 as addressed by counter 54. The newly computed value is added back into memory 12.

In a practical embodiment operational delays in components 44, 46, 22 and 18 are such that by the time the error signal would appear at the output of summer 18 the memory 12 has already advanced one or more addresses due to advancement of counter 54. Thus, in reality, as known to those of ordinary skill in the art, the error signal is typically written into memory 12 between ramp cycles by means of additional logic circuitry (not shown). But the illustrated logic is sufficient for purposes of illustrating the invention. As the data is passed from A/S 44 into threshold comparator 46, A/S 44 is reset and the above-described process repeats again for eight ramp cycles.

Assuming at the end of the next eight ramp cycles that the scaled error signal accumulated in A/S 44 is lower in value than the preset threshold as determined by preset threshold 50, a pulse will be generated on line 46b of threshold comparator 46. This pulse advances counter 52 by one additional count which is the equivalent of moving one-thousandth of the distance along the ramp of FIG. 2A. After eight more ramp cycles with counter 52 set at the second value, a pulse will be again produced either on line 46a or line 46b to either update memory 12, or in the case of an error below the threshold value set in threshold circuit 50, counter 52 will be advanced.

The process above-described will be repeated 998 more times for the exemplary embodiment until the counter 52 is at a count which counter 54 reaches at the end of the FIG. 2 ramp, that is, just beyond point III thereof by which time all necessary locations in memory 12 will have been updated. At that point in time, timing and control circuit 70 produces a pulse on line 70c which resets counter 52, signifying the end of the calibration procedure. If thereafter a cycle of a ramp cycle is initiated by T/C 70, the error signal from low pass filter 38 will be below the predetermined threshold value throughout the entire ramp.

It will be understood that the various numerical values, frequencies, times and so forth mentioned are merely by way of example. Furthermore, the ramp signal, as illustrated in FIG. 2A, is also by way of example. Thus, the actual signal desired to be produced by VCO 30 might take any form such as, for example, a portion of a sinewave or values that undulate up and down in frequency over a desired time period. Furthermore, there is no requirement that there be a delay from the end of one signal output cycle to the beginning of the next. However, if there is no delay, then appropriate high/speed circuitry will have to be provided to modify memory 12 during the time that it is reading out or at least in a brief interval between two successive readout times.

What is claimed is:

1. In a phase locked loop system which includes:

signal controllable first means for producing an output frequency signal in accordance with a drive signal applied thereto;

second means generating a signal having a phase which at least at selected times corresponds to the phase of the desired output frequency signal;

third means producing an error signal having a value proportional to the phase difference between the output and generated signals;

summing fourth means coupled to said first means to provide said drive signal thereto and having first and second summing input terminals the first responsive to said error signal;

storage fifth means coupled to said fourth means second terminal and producing signals as a function of time which ideally cause said first means to produce as a function of time a desired output frequency signal but which actually causes said first means to produce a signal such that error signals are produced by said third means;

wherein the improvement comprises:

sixth means responsive to said error signal from said third means for altering the signal in said fifth means in a sense to reduce said error signal.

2. The combination as set forth in claim 1 wherein said fifth means comprises a digital random access memory and a digital-to-analog converter responsive to signals therefrom and coupled to said fourth means second terminal to provide analog signals thereto.

3. The combination as set forth in claim 2 wherein said sixth means comprises a sample-and-hold circuit and an analog-to-digital converter said sample-and-hold circuit being receptive of said error signal from said third means for periodically sampling the error, said analog-to-digital converter for producing digital output signals corresponding in value to the value of said sampled error signals, said analog-to-digital converter being coupled to provide digital signals to said random access memory.

4. The combination as set forth in claim 3 further comprising an accumulator means coupled to receive signals from said analog-to-digital converter to accumulate a succession of such signals and to average the values of said accumulated signals.

5. The combination as set forth in claim 4 wherein said sixth means also comprises gate means coupled between said accumulator and said memory and further comprises means coupled to receive signals from said accumulator for comparing the signals received from said accumulator with a preselected value for producing a signal when said average signal exceeds said preselected threshold, said threshold comparator signal causing said gate to pass said signal from said accumulator to said memory.

6. The combination as set forth in claim 2 wherein said first means under control of said second means and fifth means generates a periodically repeating output frequency signal and wherein there is further included counter means for controlling said second means and addressing successive locations of said memory to cause the desired output frequency signal to be produced by said first means.

7. The combination as set forth in claim 5 wherein said first means under control of said second means and fifth means generates a periodically repeating output frequency signal and wherein there is further included counter means for controlling said second means and addressing successive locations of said memory to cause the desired output frequency signal to be produced by said first means.

8. The combination as set forth in claim 7 wherein said means providing a threshold comparison produces a second output signal when said averaged signal is below said preset signal and wherein said sixth means further comprises a second counter and a comparator coupled to receive the count signals in said second counter and the count signals from said first counter for producing an output when the counts in said counters are equivalent, said comparator being coupled to said sample-and-hold circuit and analog-to-digital converter circuit for providing signals thereto to cause said sample-and-hold circuit to sample said error signal and for causing said analog-to-digital converter circuit to digitize said sampled signal, said counter being incremented by said second signal produced by said threshold comparator means.

* * * * *